United States Patent
Jang et al.

(10) Patent No.: US 6,980,040 B2
(45) Date of Patent: Dec. 27, 2005

(54) DELAY ADJUSTING APPARATUS PROVIDING DIFFERENT DELAY TIMES BY PRODUCING A PLURALITY OF DELAY CONTROL SIGNALS

(75) Inventors: Ji-Eun Jang, Ichon-shi (KR); Jae-Jin Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/746,645

(22) Filed: Dec. 23, 2003

(65) Prior Publication Data

US 2004/0217795 A1 Nov. 4, 2004

(30) Foreign Application Priority Data

Apr. 29, 2003 (KR) .................. 10-2003-0027090

(51) Int. Cl.[7] ............................................. H03K 19/00

(52) U.S. Cl. .................. 327/276; 327/261; 327/153; 327/161

(58) Field of Search ................................. 327/153, 161, 327/263, 264, 269, 270, 272; 714/724–727

(56) References Cited

U.S. PATENT DOCUMENTS

| | | | |
|---|---|---|---|
| 5,878,055 A | * | 3/1999 | Allen .......................... 714/744 |
| 6,201,448 B1 | * | 3/2001 | Tam et al. ..................... 331/25 |
| 6,222,894 B1 | * | 4/2001 | Lee .............................. 375/376 |

FOREIGN PATENT DOCUMENTS

JP 11-120768 4/1999

* cited by examiner

Primary Examiner—Vibol Tan
(74) Attorney, Agent, or Firm—Blakely Sokoloff Taylor & Zafman

(57) ABSTRACT

The present invention relates to a semiconductor device; and, more particularly, to a delay adjusting circuit which is required to adjust a delay time of an internal circuit in a test mode and required to verify a characteristic and a margin of the semiconductor device. The delay adjusting apparatus according to the present invention comprises: a normal delayer for delaying an input signal from an external circuit; a delay time storage for maintaining a predetermined delay time produced by a control signal and delaying the input signal based on the predetermined delay time; and a selector for selectively outputting one of output signals from the normal delayer and the delay time storage in response to a test mode signal.

24 Claims, 7 Drawing Sheets

US 6,980,040 B2

DELAY ADJUSTING APPARATUS PROVIDING DIFFERENT DELAY TIMES BY PRODUCING A PLURALITY OF DELAY CONTROL SIGNALS

FIELD OF THE INVENTION

The present invention relates to a semiconductor device; and, more particularly, to a delay adjusting apparatus which is required to adjust a delay time of an internal circuit in a test mode and required to verify a characteristic and a margin of the semiconductor device.

BACKGROUND OF THE INVENTION

FIG. 1 is a block diagram illustrating a conventional delay adjusting circuit. Referring to FIG. 1, the conventional delay adjusting circuit includes first to third delay parts 110 to 130 and first to fourth NAND gates 141 to 144. The first delay part (delay1) 110 has six inverters to delay an input signal signal_in from an external circuit. These six inverters are in series connected to each other and work in a normal mode. The second delay part (delay2) 120 has two inverters to delay the input signal signal_in. These two inverters are also connected in series and work in a test mode. The delay time of the second delay part 120 is different from that of the first delay part 110 because the member of inverters in the first delay part 110 is different from that in the second delay part 120. The third delay part (delay3) 130 has four inverters to delay the input signal signal_in. These four inverters are in series connected to each other and work in a test mode. The delay time of the third delay part 130 is different from that of the first and second delay parts 110 and 120 because the member of inverters in the third delay part 130 is different from that in the first and second delay parts 110 and 120, respectively. The first NAND gate 141 receives an inverted signal of a test mode signal test_mode and an output signal of the first delay part 110, thereby NANDing the inverted test mode signal and the output signal of the first delay part 110. The second NAND gate 142 receives the inverted test mode signal, an output signal of the second delay part 120 and a test selection signal test_sel, thereby NANDing the received signals. The third NAND gate 143 receives the inverted test mode signal, an inverted signal of the test selection signal test_sel and an output signal of the third delay part 130, thereby NANDing the received signals. The fourth NAND gate 144 receives output signals of the first to third NAND gates 141 to 143 to perform a NAND operation.

In a normal mode, since the test mode signal test_mode is not activated and is in a low voltage level, the NAND gate 141 receiving the inverted test mode signal produces an output signal in response to the input signal signal_in. In this normal mode, the second and third NAND gates 142 and 143 are always in a high voltage level, irrespective of the input signal signal_in. The NAND gate 144 receives high voltage level signals from the second and third NAND gates 142 and 143 and an output signal (logic low level) from the first NAND gate 141, thereby producing a delay signal which is determined by a delay time of the first delay part 110. At this time, since the normal mode is not a test mode, the test selection signal test_sel is not activated and is in a low voltage level. Further, in the test mode, the first NAND gate 141 receiving an inverted signal of the test mode signal test_mode outputs a high voltage level signal irrespective of the input signal signal_in because the test mode signal is activated and is in a high voltage level.

When a delayed signal from the second delay part 120 is required during the test mode operation, the test selection signal test_sel is activated and is in a high voltage level. In this case, the third NAND gate 143 receiving the inverted signal of the test selection signal always outputs a high voltage level signal, irrespective of the input signal signal_in. Therefore, only second NAND gate 142 produces an output signal responsive to the input signal signal_in. The fourth NAND gate 144 receives an output signal of the second NAND gate 142, which is produced by the delay signal from the second delay part 120, to receive the input signal signal_in.

On the other hand, when a delayed signal from the third delay part 130 is required during the test operation, the test selection signal test_sel is activated and is in a high voltage level. In this case, the second NAND gate 142 receiving the inverted signal of the test selection signal always outputs a high voltage level signal, irrespective of the input signal signal_in. Therefore, only third NAND gate 143 outputs an output signal responsive to the input signal signal_in. The fourth NAND gate 144 receives an output signal of the third NAND gate 143, which is produced by the delay signal from the third delay part 130, to receive the input signal signal_in.

However, since the above-mentioned delay adjusting device is limited to a few numbers of delay parts, only predetermined delay time can be achieved. As a result, the conventional delay adjusting device can not obtain different kinds of testing modes. Even if a member of delay parts and a decoding circuit can be considered in a modification circuit, each bit of the test address to select a delay part must be allocated to corresponding pins and lots of pins must be provided. Further, it is difficult to provide many numbers of pins which are sufficient to provide various delay time.

SUMMARY OF THE INVENTION

It is, therefore, an object of the present invention to provide a delay adjusting device capable of providing different delay signals in semiconductor memory devices.

It is another object of the present invention to provide a delay adjusting device which can receive different delay input signals and can provide different delay signals by storing the inputted delay signals.

In accordance with an aspect of the present invention, there is provided a delay adjusting apparatus in a semiconductor device comprising: a normal delay means for delaying an input signal from an external circuit; a delay time storage means for maintaining a predetermined delay time produced by a control signal and delaying the input signal based on the predetermined delay time; and a selection means for selectively outputting one of output signals from the normal delay means and the delay time storage means in response to a test mode signal.

In accordance with another aspect of the present invention, there is provided a delay adjusting apparatus in a semiconductor device comprising: a control signal divider for producing a plurality delay control signals using an input control signal in a test mode; and a plurality of unit delayers which are in series coupled to each other, wherein each unit delayer selectively outputs a delayed input data signal in response to each of the delay control signals. The control signal divider includes: a plurality of delayers, which are in series coupled to each other, for delaying the input control signal and outputting a plurality of delayed control signals;

and a pulse adjusting means for adjusting and trimming a plurality of delayed control signals in response to a test mode signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 1:
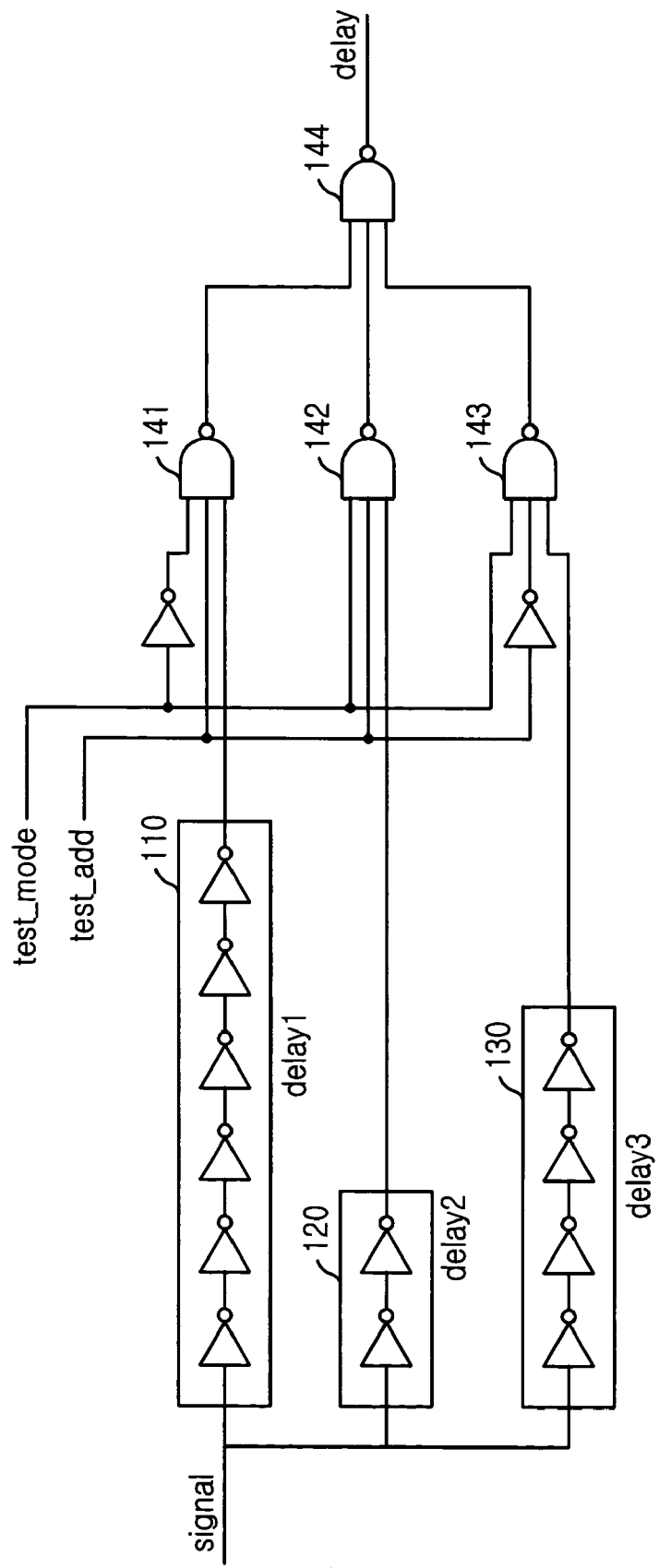
FIG. 1 is a block diagram illustrating a conventional delay adjusting circuit.
Figure 2:
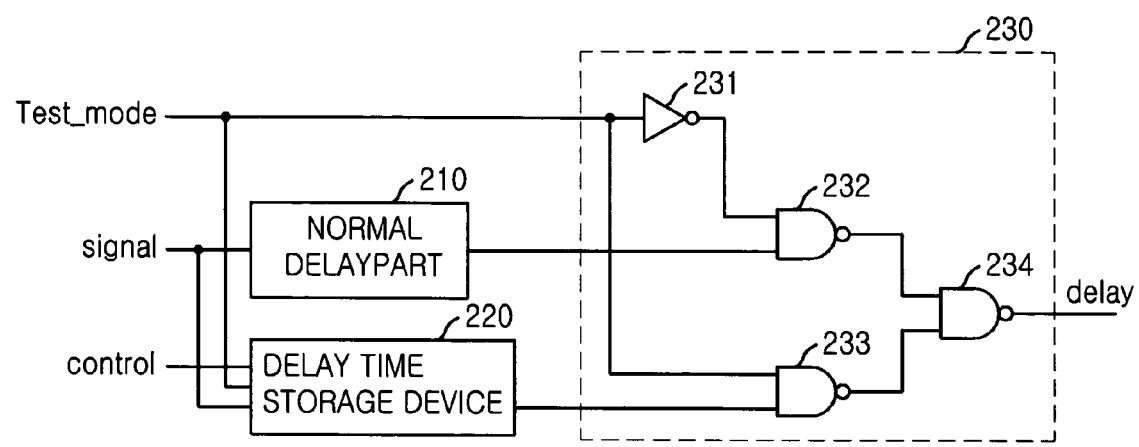
FIG. 2 is a block diagram illustrating a delay adjusting circuit according to an embodiment of the present invention.

First, referring to FIG. 2, a delay adjusting device according to the present invention includes a normal delay part 210, a delay time storage device 220 and a selection unit 230. The normal delay part 210 delays an input signal signal_in inputted from an external circuit and outputs a delayed input signal to the selection unit 230. The delay time storage device 220 stores a delay time, which is set up by a control signal, and outputs a delayed input signal to the selection unit 230 after delaying the input signal signal_in based on the delay time.

The selection unit 230 receives a test mode signal test_mode. In case that the test mode signal test_mode is in a low voltage level, the selection unit 230 outputs a delay signal from the normal delay part 210 as an output signal and, in case that the test mode signal test_mode is in a high voltage level, the selection unit 230 outputs a delay signal from the delay time storage device 220 as an output signal.

A first inverter 231 in the selection unit 230 inverts the received test mode signal test_mode and outputs the inverted test mode signal to a first NAND gate 232. The first NAND gate 232 receives output signals of the first inverter 231 and the normal delay part 210 in order to perform the NAND operation and outputs the result of the NAND operation. A second NAND gate 233 in the selection unit 230 receives the test mode signal test_mode and an output signal of the delay time storage device 220 in order to perform the NAND operation and outputs the result of the NAND operation. Output signals of the first and second NAND gates 232 and 233 are inputted into a third NAND gage 234 and the third NAND gage 234 outputs a NAND operation signal as a delay signal delay_out.

Figure 3:
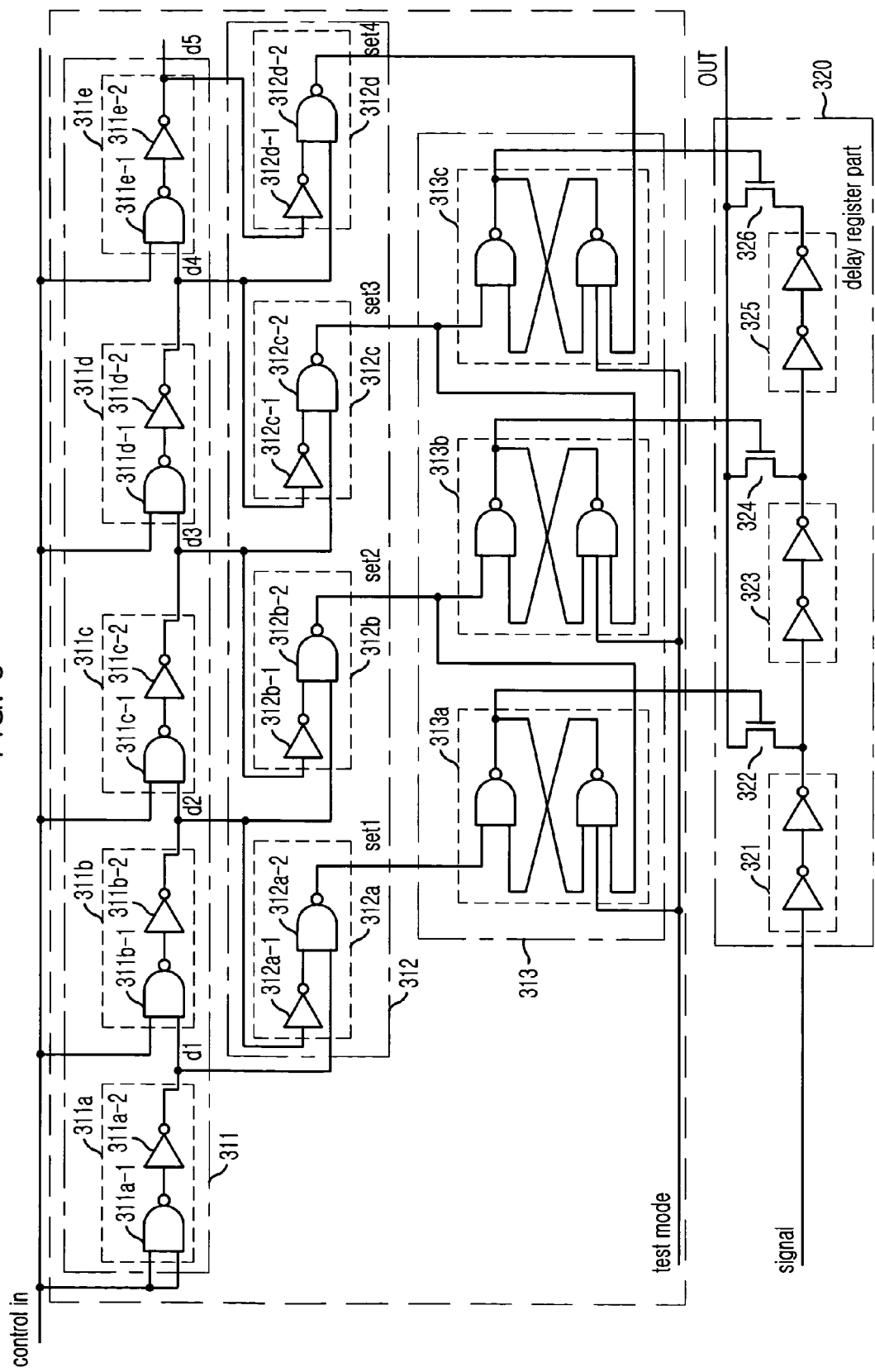
FIG. 3 is a block diagram illustrating a delay time storage device, which has a delay register unit, in the delay adjusting circuit of FIG. 2.

FIG. 3 is a block diagram illustrating the delay time storage device 220 in the delay adjusting circuit of FIG. 2.

Referring to FIG. 3, the delay time storage device 220 includes a delay time determining unit 310 and a delay register unit 320. The delay time determining unit 310 receives the test mode signal test_mode and a control signal ctrl. While the test mode signal test_mode is in a high voltage level, one of first to third delay control signals p1 to p3 is activated in a high voltage level and other two delay control signals are in a low voltage level.

The delay time determining unit 310 includes a delay chain 311, a pulse width adjusting unit 312 and a pulse width constraining unit 313.

The delay chain 311 includes a plurality of unit delay elements each of which receives the control signal ctrl. In this embodiment, the plurality of unit delay elements are made up of first to fifth unit delay elements 311a to 311e.

A first unit delay signal d1 produced by the first unit delay element 311a goes from a low voltage level to a high voltage level after one unit delay time (T) from a rising edge of the control signal ctrl and goes from a high voltage level to a low voltage level with a falling edge of the control signal ctrl.

A fourth NAND gate 311a-1 in the first unit delay element 311a has two input terminals each of which receives the control signal ctrl and performs a NAND operation of the received signals, thereby outputting a result of the NAND operation to a second inverter 311a-2. The second inverter 311a-2 inverts an output signal of the fourth NAND gate 311a-1 and outputs an inverted signal as the first unit delay signal d1.

A second unit delay signal d2 produced by the second unit delay element 311b goes from a low voltage level to a high voltage level after two unit delay times (2T) from a rising edge of the control signal ctrl and goes from a high voltage level to a low voltage level with a falling edge of the control signal ctrl.

A fifth NAND gate 311b-1 in the second unit delay element 311b has two input terminals, each of which receives the control signal ctrl and the first unit delay signal d1, and performs a NAND operation of the received signals and outputs a result of the NAND operation to a third inverter 311b-2. The third inverter 311b-2 inverts an output signal of the fifth NAND gate 311b-1 and outputs an inverted signal as the second unit delay signal d2.

The third unit delay signal d3 in the third unit delay element 311c goes from a low voltage level to a high voltage level after three unit delay times (3T) from a rising edge of the control signal ctrl and goes from a high voltage level to a low voltage level with a falling edge of the control signal ctrl, thereby producing a third unit delay signal d3; however, the third unit delay signal d3 is kept in a low voltage level because the control signal falls down after three unit delay times (3T) falls down. In the third unit delay element 311c, a sixth NAND gate 311c-1 in the third unit delay element 311c has two input terminals, each of which receives the control signal ctrl and the second unit delay signal d2, and performs a NAND operation of the received signals and outputs a result of the NAND operation to a fourth inverter 311c-2. The fourth inverter 311c-2 inverts an output signal of the sixth NAND gate 311c-1 and outputs an inverted signal as the third unit delay signal d3.

The fourth unit delay signal d4 in the fourth unit delay element 311d goes from a low voltage level to a high voltage level after four unit delay times (4T) from a rising edge of the control signal ctrl and goes from a high voltage level to a low voltage level with a falling edge of the control signal ctrl, thereby producing a fourth unit delay signal d4; however, the fourth unit delay signal d4 is also kept in a low voltage level because the control signal falls down after three unit delay times (3T) falls down. In the fourth unit delay element 311d, a seventh NAND gate 311d-1 in the fourth unit delay element 311d has two input terminals, each of which receives the control signal ctrl and the third unit delay signal d3, and performs a NAND operation of the received signals and outputs a result of the NAND operation to a fifth inverter 311d-2. The fifth inverter 311d-2 inverts an output signal of the seventh NAND gate 311d-1 and outputs an inverted signal as the fourth unit delay signal d4.

Furthermore, the fifth unit delay signal d5 in the fifth unit delay element 311e goes from a low voltage level to a high voltage level after five unit delay times (5T) from a rising edge of the control signal ctrl and goes from a high voltage level to a low voltage level with a falling edge of the control signal ctrl, thereby producing a fifth unit delay signal d5; however, the fifth unit delay signal d5 is also kept in a low voltage level because the control signal falls down after three unit delay times (3T) falls down. In the fifth unit delay element 311e, an eighth NAND gate 311e-1 in the fifth unit delay element 311e has two input terminals, each of which receives the control signal ctrl and the fourth unit delay signal d4, and performs a NAND operation of the received signals and outputs a result of the NAND operation to a sixth inverter 311e-2. The sixth inverter 311e-2 inverts an output signal of the eighth NAND gate 311e-1 and outputs an inverted signal as the fifth unit delay signal d5.

In the unit delay elements 311a to 311e, the unit delay signal is kept in a low voltage level if the control signal ctrl is falling down before a low voltage level goes to a high voltage level. That is, a high voltage level of the unit delay signal is limited in a high voltage level duration of the control signal ctrl.

The pulse width adjusting unit 312 in the delay time determining unit 310 includes first to fourth unit control signal generators 312a to 312d which are in parallel connected to each other. Each of the unit control signal generators 312a to 312d receives two unit delay signals from the delay chain 311.

The first unit control signal generator 312a receives the first unit delay signal d1 and the second unit delay signal d2 and outputs a first set signal set1. In case that the first unit delay signal d1 is in a high voltage level and the second unit delay signal d2 is in a low voltage level, the first set signal set1 is outputted in a low voltage level. Also, the first unit control signal generator 312a includes a seventh inverter 312a-1 and a ninth NAND gate 312a-2. The seventh inverter 312a-1 receives and inverts the second unit delay signal d2 and the ninth NAND gate 312a-2 receives the inverted unit delay signal from the seventh inverter 312a-1 and the first unit delay signal d1 in order to perform the NAND operation.

The second unit control signal generator 312b receives the second unit delay signal d2 and the third unit delay signal d3 and outputs a second set signal set2. In case that the second unit delay signal d2 is in a high voltage level and the third unit delay signal d3 is in a low voltage level, the second set signal set2 is outputted in a low voltage level. Also, the second unit control signal generator 312b includes an eighth inverter 312b-1 and a tenth NAND gate 312b-2. The eighth inverter 312b-1 receives and inverts the third unit delay signal d3 and the tenth NAND gate 312b-2 receives the inverted unit delay signal from the eighth inverter 312b-1 and the second unit delay signal d2 in order to perform the NAND operation.

The third unit control signal generator 312c receives the third unit delay signal d3 and the fourth unit delay signal d4 and outputs a third set signal set3. In case that the third unit delay signal d3 is in a high voltage level and the fourth unit delay signal d4 is in a low voltage level, the third set signal set3 is outputted in a low voltage level. Also, the third unit control signal generator 312c includes a ninth inverter 312c-1 and an eleventh NAND gate 312c-2. The ninth inverter 312c-1 receives and inverts the fourth unit delay signal d4 and the eleventh NAND gate 312c-2 receives the inverted unit delay signal from the ninth inverter 312c-1 and the third unit delay signal d3 in order to perform the NAND operation.

The fourth unit control signal generator 312d receives the fourth unit delay signal d4 and the fifth unit delay signal d5 and outputs a fourth set signal set4. In case that the fourth unit delay signal d4 is in a high voltage level and the fifth unit delay signal d5 is in a low voltage level, the fourth set signal set4 is outputted in a low voltage level. Also, the fourth unit control signal generator 312d includes a tenth inverter 312d-1 and a twelfth NAND gate 312d-2. The ninth inverter 312a-1 receives and inverts the fourth unit delay signal d4 and the twelfth NAND gate 312d-2 receives the inverted unit delay signal from the tenth inverter 312d-1 and the fourth unit delay signal d4 in order to perform the NAND operation.

The pulse width constraining unit 313 includes first to third flip-flops 313a to 313c. The pulse width constraining unit 313 receives the first to fourth set signals set1 to set4 from the control signal generating unit 312, while the test mode signal test_mode is in a high voltage level, and outputs one of the delay control signals p1 to p3 in a high voltage level in response to the first to fourth set signals set1 to set4. At this time, only one of the first to third delay control signals p1 to p3 is activated in a high voltage level and other delay control signals are kept in a low voltage level.

The first flip-flop 313a receives the test mode signal test_mode and the first and second set signals set1 and set2 and outputs the first delay control signal p1. When the first set signal set1 goes to a low voltage level, the first flip-flop 313a makes the first delay control signal p1 go to a high voltage level and, when the second set signal set2 goes to a high voltage level, the flip-flop 313a makes the first delay control signal p1 go to a low voltage level.

The second flip-flop 313b receives the test mode signal test_mode and the second and third set signals set2 and set3 and outputs the second delay control signal p2. When the second set signal set2 goes to a low voltage level, the second flip-flop 313b makes the second delay control signal p2 to go a high voltage level and, when the third set signal set3 goes to a high voltage level, the flip-flop 313b makes the second delay control signal p2 to go a low voltage level.

The third flip-flop 313c receives the test mode signal test_mode and the third and fourth set signals set3 and set4 and outputs the third delay control signal p3. When the third set signal set3 goes to a low voltage level, the third flip-flop 313c makes the third delay control signal p3 be in a high voltage level; however, the third delay control signal p3 in this embodiment is kept in a low voltage level because the third set signal set3 is kept in a high voltage level.

On the other hand, the delay register unit 320 includes first to third unit delayers 321, 323 and 325 and first to third switches 322, 324 and 326. The first to third unit delayers 321, 323 and 325 are in series couple to each other and the first to third switches 322, 324 and 326 respectively transfer output signals of the first to third unit delayers 321, 323 and 325 to an output terminal of the delay time storage device 220.

The first unit delayer 321 includes two inverters which are in series coupled to each other and receives the input signal signal_in, thereby outputting a delayed input signal. The first switch 322 transfers the delayed input signal to the output terminal of the delay time storage device 220 in response to a high voltage level of the first delay control signal p1 from the first flip-flop group 313a.

The second unit delayer 323 also includes two inverters which are in series coupled to each other and receives the delayed input signal from the first unit delayer 321, thereby outputting a delayed input signal. The second switch 324 transfers the delayed input signal, which is caused by the second unit delayer 323, to the output terminal of the delay time storage device 220 in response to a high voltage level of the second delay control signal p2 from the first flip-flop group 313b.

Also, the third unit delayer 325 includes two inverters which are in series coupled to each other and receives the delayed input signal from the second unit delayer 323, thereby outputting a delayed input signal. The second switch 326 transfers the delayed input signal, which is caused by the third unit delayer 325, to the output terminal of the delay time storage device 220 in response to the third delay control signal p3 from the first flip-flop group 313c.

Figure 5:
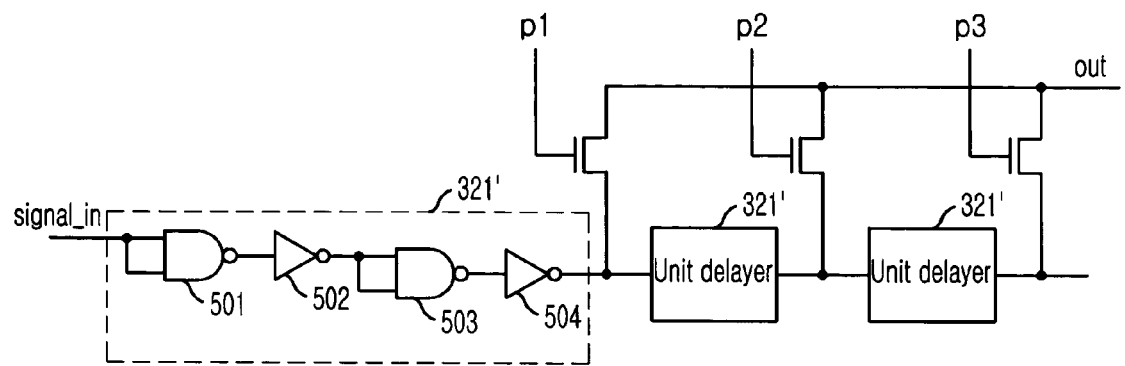
FIG. 5 is a block diagram illustrating a unit delayer according to another embodiment of the present invention.

FIG. 5 is a block diagram illustrating a unit delayer according to another embodiment of the present invention. Referring to FIG. 5, a unit delayer 321' according to another embodiment of the present invention includes two NAND gates 501 and 503 and two inverters 502 and 504. The NAND gates 501 and 503 and the inverters 502 and 504 are alternatively coupled in series and each of the NAND gates 501 and 503 has two input terminals which receive the same input signal.

Figure 6:
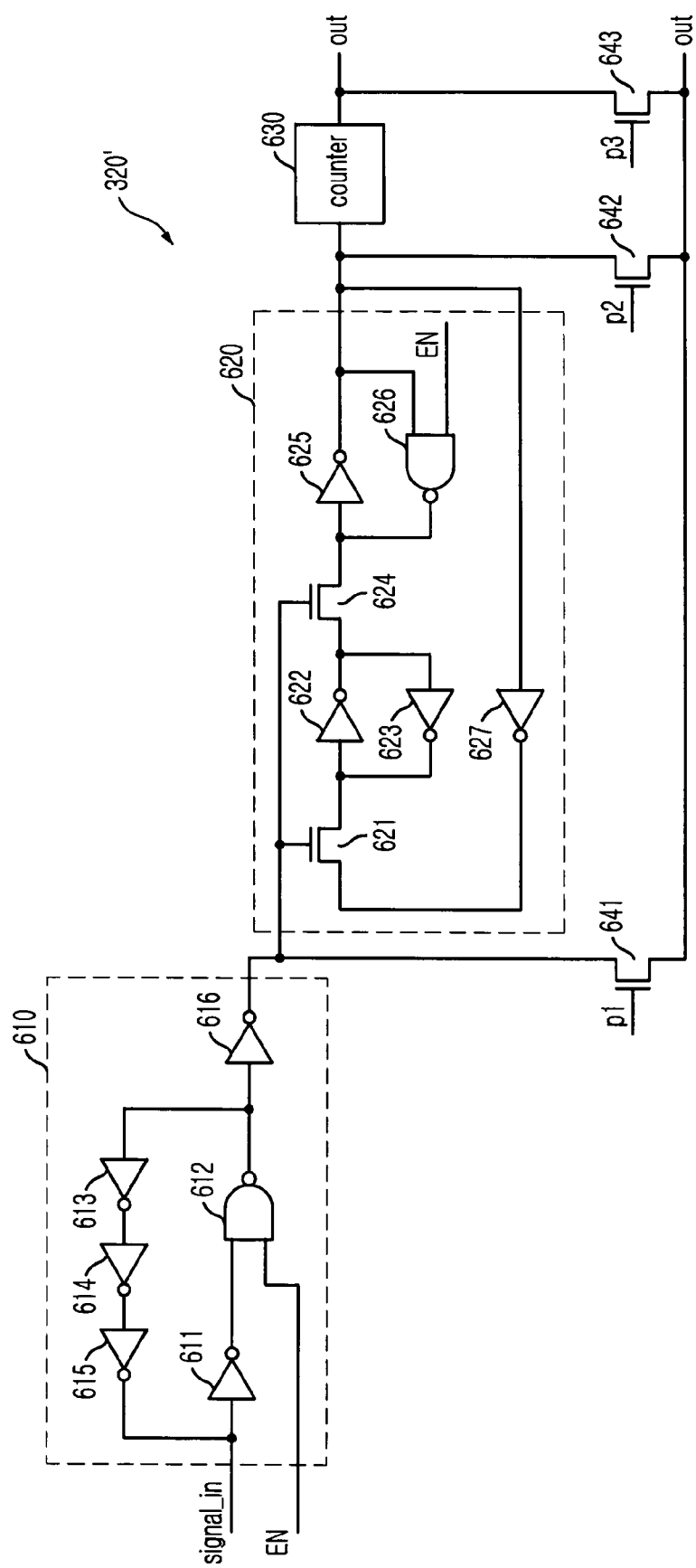
FIG. 6 is a block diagram illustrating a delay register unit according to further another embodiment of the present invention.

FIG. 6 is a block diagram illustrating a delay register unit 320' according to another embodiment of the present invention. The delay register unit 320' includes a plurality of delay counters 610 to 630 which are enabled by an enable signal. The delay counter 610 receives the enable signal EN and the input signal signal_in and produces a delay input signal.

In the delay counter 610, an eleventh inverter 611 receives and inverts the input signal signal_in. A thirteen NAND gate 612 receives the enable signal EN and an output signal of the eleventh inverter 611 in order to perform a NAND operation.

A twelfth inverter 613 inverts an output signal of the thirteenth NAND gate 612, a thirteenth inverter 614 inverts an output signal of the twelfth inverter 613, and a fourteenth inverter 615 coupled to an input terminal of the eleventh inverter 611 inverts an output signal of the thirteenth inverter 614. Also, a fifteenth inverter 616 inverts the output signal of the thirteenth NAND gate 612. A switch 641 transfers the output signal of the delay counter 610, Each of the delay counters 620 and 630 receives the enable signal EN and has a delay time twice as long as an amount of the delay in the delay counter 610. A first transistor 621 in the delay counter 620 has a gate to which the output signal of the delay counter 610 is applied. A sixteenth inverter 622 is coupled to the first transistor 621 and inverts an output signal of the first transistor 621. A seventeenth inverter 623 receives and inverts an output signal of the sixteenth inverter 622, thereby forming a latch circuit together with the sixteenth inverter 622. A second transistor 624 has a gate to which the output signal of the delay counter 610 is applied and is coupled to the sixteenth inverter 622. An eighteenth inverter 625 is coupled to the second transistor 624 and inverts an output signal of the second transistor 624. A fourteenth NAND gate 626 receives the enable signal EN and an inverted signal from the eighteenth inverter 625 and outputs the result of the NAND operation to the eighteenth inverter 625. A nineteenth inverter 627 inverts an output signal of the eighteenth inverter 625 and outputs the inverted signal to the first transistor 621. A switch 642 in the delay register unit 320' transfers the output signal of the delay counter 620

On the other a switch 643 in the delay register unit 320' transfers the output signal of the delay counter 630. The control signals p1, p2 and p3 are applied to the gate of the switches 641, 642 and 643, respectively. In case that control signals p1, p2 and p3 are in a high voltage level, the switches 641, 642 and 643 respectively transfer an input voltage to the output terminal of the delay register unit 320'.

Figure 7:
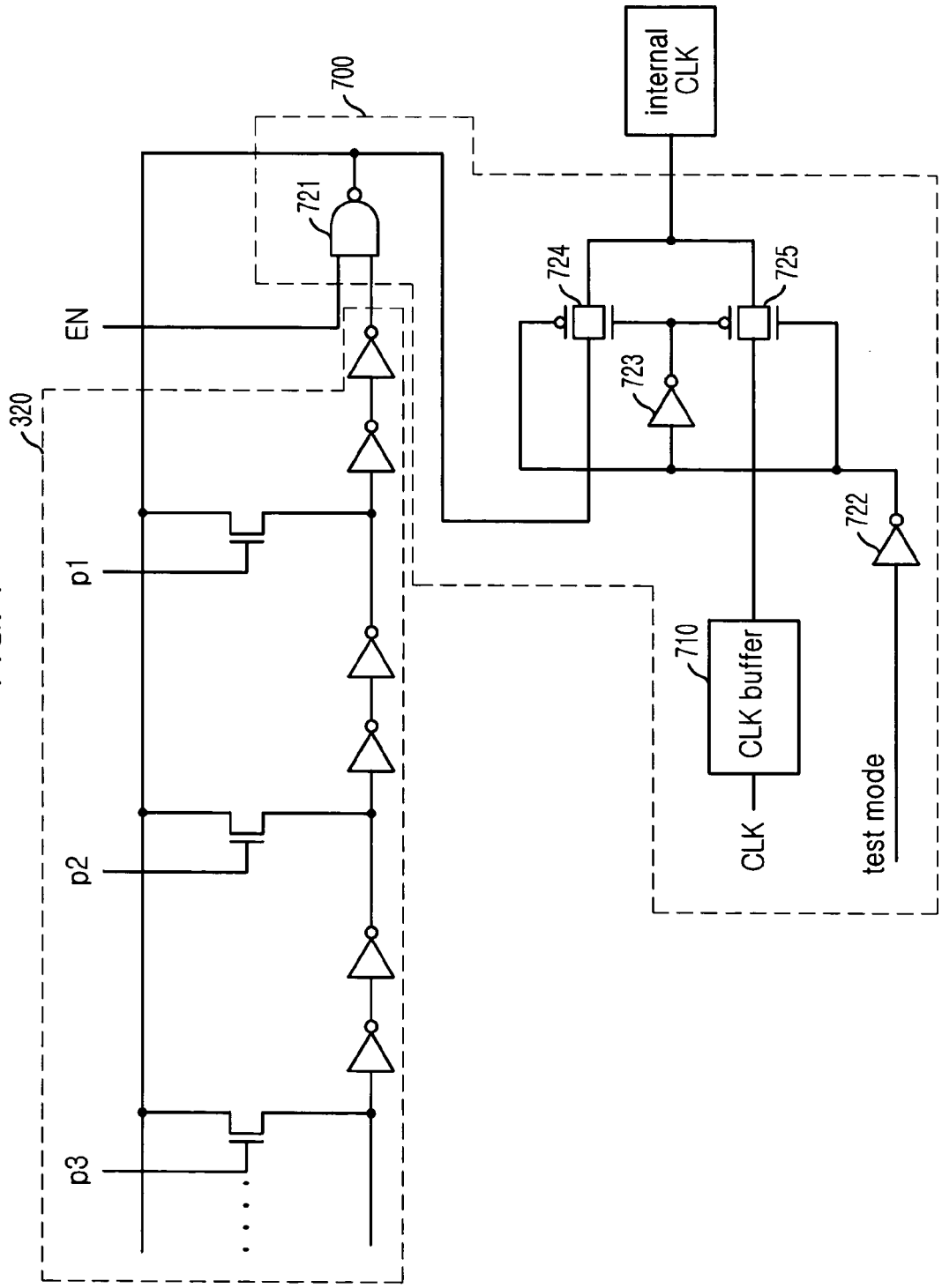
FIG. 7 is a block diagram illustrating a clock signal adjusting unit according to the present invention.

FIG. 7 is a block diagram illustrating a clock signal adjusting unit according to the present invention. Referring to FIG. 7, an external clock buffer 710 temporally stores an external clock signal CLK and thereafter outputs the stored clock signal to a clock signal adjusting unit 700. In FIG. 7, the delay register unit in FIG. 6 is denoted as the same reference numeral 320.

The clock signal adjusting unit 700 receives the enable signal EN, an output signal of the external clock buffer 710, an output signal of the delay register unit 320 and the test mode signal test_mode. In case that the enable signal EN is in a high voltage level and the test mode signal test_mode is in a high voltage level, an internal clock generator outputs the output signal of the delay register unit 320 as an internal clock signal. In case that the test mode signal test_mode is in a low voltage level, the internal clock generator outputs the output signal of the external clock buffer 710 as the internal clock signal. Accordingly, the clock signal adjusting unit 700 produces internal clock signal using the delayed input signal in the test mode and the clock signal adjusting unit 700 produces internal clock signal using the external delayed input signal in a normal mode.

In the clock signal adjusting unit 700, a fifteenth NAND gate 721 is coupled to the delay register unit 320 for NANDing the output signal of the delay register unit 320 and the enable signal EN.

As mentioned above, the clock signal adjusting unit 700 selectively transfers the output signal of the delay register unit 320 or the output signal of the clock buffer 710. A twentieth inverter 722 inverts the test mode signal test_mode and the inverted test mode signal is inputted into the first and second pass gates 724 and 725. Also, a twenty-first inverter 723 inverts the inverted test mode signal again and the re-inverted test mode signal is inputted into the second pass gates 724 and 725. The output signal of the fifteenth NAND gate 721 is transferred to the internal clock generator in response to the inverted test mode signal and the re-inverted test mode signal and the clock signal from the clock buffer 710 is also transferred to the internal clock generator in response to the inverted test mode signal and the re-inverted test mode signal.

Referring again to FIG. 4, the normal delay part 210 outputs a delayed signal to the selection unit 230 after delaying the input signal signal_in from an external circuit. Since the selection unit 230 receives the test mode signal test_mode in a low voltage level at the initial time, the selection unit 230 outputs the output signal of the normal delay part 210 as a delayed signal. That is, the first inverter 231 inverts the test mode signal test_mode and outputs the inverted test mode signal in a high voltage level to the first NAND gate 232. Since the first NAND gate 232 performs the NAND operation of the test mode signal test_mode and the output signal of the normal delay part 210 and outputs the result of the NAND operation to the third NAND gate 234, the output signal of the normal delay part 210 is reflected on the output signal of the delay adjusting circuit in FIG. 2. The second NAND gate 233 performs the NAND operation of the test mode signal test_mode of a low voltage level and the output signal of the delay time storage device 220 and outputs the result of the NAND operation to the third NAND gate 234. Accordingly, the output signal of the delay time storage device 220 is reflected on the output signal of the delay adjusting circuit in FIG. 2.

Figure 4:
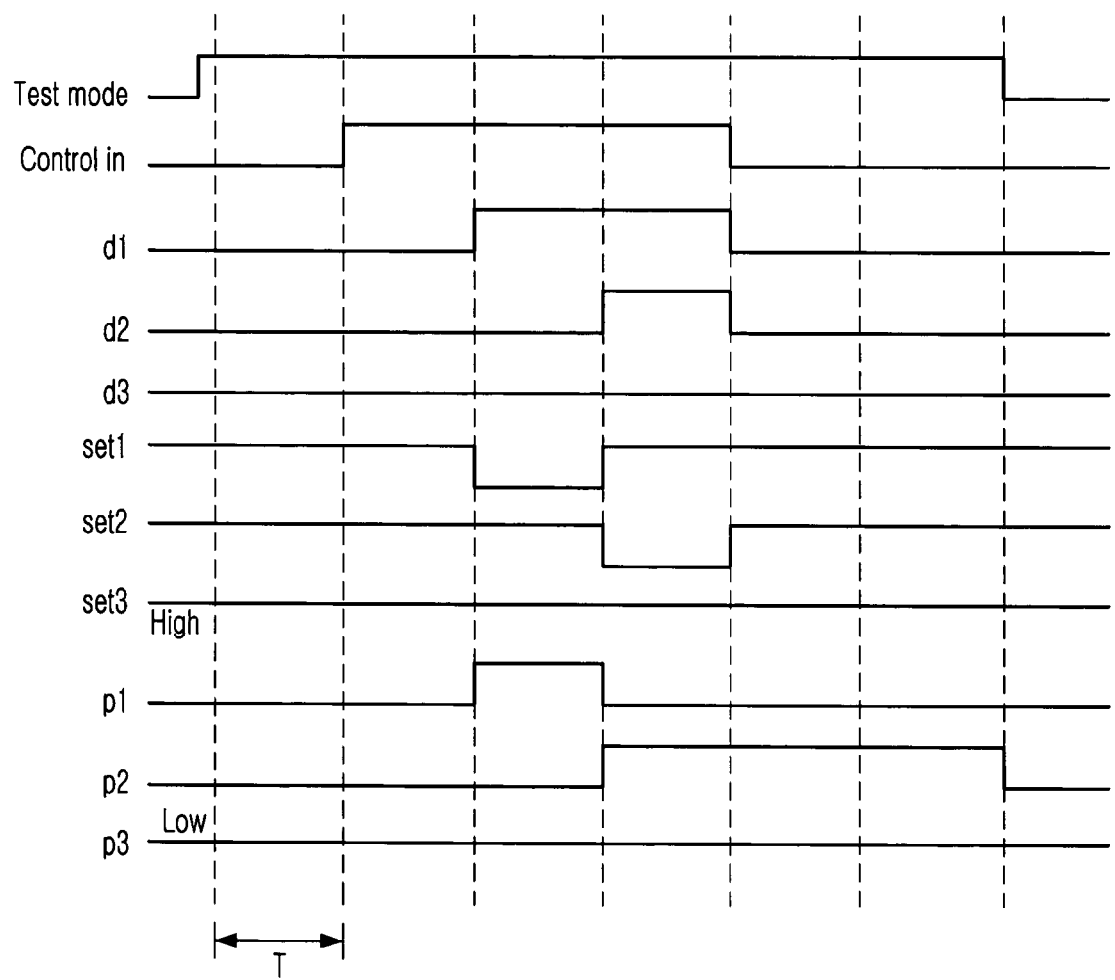
FIG. 4 is a timing chart illustrating the delay adjusting circuit of FIG. 2.

In the test mode, the delay time storage device 220 outputs the delayed input signal signal_in to the selection unit 230 based on the delay control signals p1 to p3 which are created by the control signal ctrl. The control unit 310 receives the test mode signal test_mode of a high voltage level during the test mode operation. The first unit delay element 311a in the delay chain 311 receives the control signal ctrl and delays the rising edge of the control signal ctrl by the delay time T. Further, since the second to fifth unit delay elements 311b to 311e are in series connected to each other and each of them receives an output signal of the previous unit delay element, the second to fifth unit delay elements 311b to 311e delay the rising edge of the control signal ctrl by the delay time 2T, 3T, 4T and 5T, respectively. However, it should be noted that the output signals of the first to fifth unit delay elements 311a to 311e are limited within the high voltage level so that a high voltage level is not shown on the third unit delay signal d3. The amount of the delay time T is determined by the NAND gate and the inverter in each of the first to fifth unit delay elements 311a to 311e. The first to fourth unit control signal generators 312a to 312d in the pulse width adjusting unit 312 respectively have one inverter and one NAND gate which receives the adjacent two unit delay signals so that they controls the pulse width of the unit delay signals and outputs the first to third set signals set1 to set3. The first to third flip-flops 313a to 313c in the pulse width constraining unit 313 respectively produces the first to third delay control signals p1 to p3. As shown in FIG. 4, the first set signal set1 is in a high voltage level at the first time. When the first set signal set1 goes from the high voltage level to a low voltage level, the first delay control signal p1 goes to a high voltage level and, when the second set signal set2 goes from a high voltage level to a low voltage level, the first delay control signal p1 goes to a low voltage level. Since the set signal set3 is in a high voltage level, the second delay control signal p2 is in a high voltage level for 3T within the test mode. Accordingly, high voltage levels of the first to third delay control signal p1 to p3 are not overlapped.

As illustrated above, in accordance with the present invention, different delay times can be provide in the different test modes. Further, since the present invention use a control signal to provide the different delay time, the structure of the delay adjusting circuit can be simplified.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay adjusting apparatus in a semiconductor device comprising:
   a normal delay means for delaying an input signal from an external circuit;
   a delay time storage means for maintaining a predetermined delay time produced by a control signal and delaying the input signal based on the predetermined delay time; and
   a selection means for selectively outputting one of output signals from the normal delay means and the delay time storage means in response to a test mode signal.

2. The delay adjusting apparatus in accordance with claim 1, wherein the selection means includes:
   a first inverter for inverting the test mode signal;
   a first NAND gate for NANDing an output signal from the first inverter and the output signal from the normal delay means;
   a second NAND gate for NANDing the test mode signal and the output signal from the delayed input signal generating means; and
   a third NAND gate for NANDing outputs signals from the first and second NAND gate and outputting a delay signal.

3. The delay adjusting apparatus in accordance with claim 1, wherein the delay time storage means includes:
   a delay time determining unit for receiving the test mode signal and for activating one of a plurality of delay control signals while the test mode signal is in a high voltage level, wherein the pulse widths of the delay control signals is determined by a duration of a high level of the control signal; and
   a delay register unit which includes:
   a plurality of unit delayers, which are in series coupled to each other, in order to delay the input signal; and
   a plurality of switches for selectively outputting a delayed input signal in response to the delay control signals, respectively.

4. The delay adjusting apparatus in accordance with claim 3, wherein the delay time determining unit includes:
   a delay chain, which has a plurality of unit delayers which delay the control signal, for outputting unit delay signals;
   a pulse width adjusting unit for receiving the unit delay signals and adjusting pulse widths of the unit delay signals, outputting adjusted pulsation signals; and
   a pulse width constraining unit for receiving the test mode signal and an output signal from the pulse width adjusting unit and producing the plurality of delay control signals.

5. The delay adjusting apparatus in accordance with claim 4, wherein the plurality of unit delayers includes:
   a first unit delay element for producing a first unit delay signal which goes from a low voltage level to a high voltage level after one unit delay time (T) from a rising edge of the control signal and goes from a high voltage level to a low voltage level with a falling edge of the control signal;
   a second unit delay element for producing a second unit delay signal which goes from a low voltage level to a high voltage level after two unit delay times (2T) from a rising edge of the control signal and goes from a high voltage level to a low voltage level with a falling edge of the control signal;
   a third unit delay element for producing a third unit delay signal which goes from a low voltage level to a high voltage level after three unit delay times (3T) from a rising edge of the control signal and goes from a high voltage level to a low voltage level with a falling edge of the control signal;
   a fourth unit delay element for producing a fourth unit delay signal which goes from a low voltage level to a high voltage level after four unit delay times (4T) from a rising edge of the control signal and goes from a high voltage level to a low voltage level with a falling edge of the control signal; and a fifth unit delay element for producing a fifth unit delay signal which goes from a low voltage level to a high voltage level after five unit delay times (5T) from a rising edge of the control signal and goes from a high voltage level to a low voltage level with a falling edge of the control signal.

6. The delay adjusting apparatus in accordance with claim 5, wherein the first unit delay element includes:

a fourth NAND gate, which has two input terminals each of which receives the control signal, for NANDing the control signal; and a second inverter for inverting an output signal from the fourth NAND gate and for outputting an inverted signal as the first unit delay signal.

7. The delay adjusting apparatus in accordance with claim 5, wherein the second unit delay element includes:

a fifth NAND gate for NANDing the control signal and the first unit delay signal from the first unit delay element; and a third inverter for inverting an output signal from the fifth NAND gate and for outputting an inverted signal as the second unit delay signal.

8. The delay adjusting apparatus in accordance with claim 5, wherein the third unit delay element includes:

a sixth NAND gate for NANDing the control signal and the second unit delay signal from the second unit delay element; and a fourth inverter for inverting an output signal from the sixth NAND gate and for outputting an inverted signal as the third unit delay signal.

9. The delay adjusting apparatus in accordance with claim 5, wherein the fourth unit delay element includes:

a seventh NAND gate for NANDing the control signal and the third unit delay signal from the third unit delay element; and a fifth inverter for inverting an output signal from the seventh NAND gate and for outputting an inverted signal as the fourth unit delay signal.

10. The delay adjusting apparatus in accordance with claim 5, wherein the fifth unit delay element includes:

an eighth NAND gate for NANDing the control signal and the fourth unit delay signal from the fourth unit delay element; and a sixth inverter for inverting an output signal from the eighth NAND gate and for outputting an inverted signal as the fifth unit delay signal.

11. The delay adjusting apparatus in accordance with claim 5, wherein the pulse width adjusting unit includes:

a first unit control signal generating circuit for receiving the first unit delay signal and the second unit delay signal and for initially outputs a first set signal in a high voltage level, wherein the first unit control signal generating circuit outputs the first set signal of a low voltage level when the first unit delay signal is in a high voltage level and the second unit delay signal is in a low voltage level;

a second unit control signal generating circuit for receiving the second unit delay signal and the third unit delay signal and for initially outputs a second set signal in a high voltage level, wherein the second unit control signal generating circuit outputs the second set signal of a low voltage level when the second unit delay signal is in a high voltage level and the third unit delay signal is in a low voltage level;

a third unit control signal generating circuit for receiving the third unit delay signal and the fourth unit delay signal and for initially outputs a third set signal in a high voltage level, wherein the third unit control signal generating circuit outputs the third set signal of a low voltage level when the third unit delay signal is in a high voltage level and the fourth unit delay signal is in a low voltage level; and a fourth unit control signal generating circuit for receiving the fourth unit delay signal and the fifth unit delay signal and for initially outputs a fourth set signal in a high voltage level, wherein the fourth unit control signal generating circuit outputs the fourth set signal of a low voltage level when the fourth unit delay signal is in a high voltage level and the fifth unit delay signal is in a low voltage level.

12. The delay adjusting apparatus in accordance with claim 11, wherein the first unit control signal generating circuit includes:

a seventh inverter for inverting the second unit delay signal; and a ninth NAND gate for NANDing the inverted unit delay signal from the seventh inverter and the first unit delay signal.

13. The delay adjusting apparatus in accordance with claim 11, wherein the second unit control signal generating circuit includes:

an eighth inverter for inverting the third unit delay signal; and a tenth NAND gate for NANDing the inverted unit delay signal from the eighth inverter and the second unit delay signal.

14. The delay adjusting apparatus in accordance with claim 13, wherein the third unit control signal generating circuit includes:

a ninth inverter for inverting the fourth unit delay signal; and an eleventh NAND gate for NANDing the inverted unit delay signal from the ninth inverter and the third unit delay signal.

15. The delay adjusting apparatus in accordance with claim 11, wherein the fourth unit control signal generating circuit includes:

a tenth inverter for inverting the fifth unit delay signal; and a twelfth NAND gate for NANDing the inverted unit delay signal from the tenth inverter and the fourth unit delay signal.

16. The delay adjusting apparatus in accordance with claim 11, wherein the plurality of delay control signals includes first to third delay control signals, wherein the pulse width constraining unit includes:

a first flip-flop for receiving the test mode signal and the first and second set signals and initially outputs the first delay control signal in a high voltage level, for making the first delay control signal be in a high voltage level when the first set signal goes to a low voltage level, and for making the first delay control signal be in a low voltage level when the second set signal goes to a high voltage level;

a second flip-flop for receiving the test mode signal and the second and third set signals and initially outputs the second delay control signal in a high voltage level, for making the second delay control signal be in a high voltage level when the second set signal goes to a low voltage level, and for making the second delay control signal be in a low voltage level when the third set signal goes to a high voltage level; and a third flip-flop for receiving the test mode signal and the third and fourth set signals and initially outputs the third delay control signal in a high voltage level, for making the third delay control signal be in a high voltage level when the third set signal goes to a low voltage level, and for making the third delay control signal be in a low voltage level when the fourth set signal goes to a high voltage level.

17. The delay adjusting apparatus in accordance with claim 16, wherein the plurality of unit delayers includes:

a first delayer having two inverters which are in series coupled to each other for delaying the input signal;

a second delayer coupled to the first delayer and having two inverters which are in series coupled to each other for delaying an output signal from the first delayer; and a second delayer coupled to the first delayer and having two inverters which are in series coupled to each other for delaying an output signal from the second delayer.

18. The delay adjusting apparatus in accordance with claim 17, wherein the plurality of switches includes:

a first switching transistor for outputting an output signal from the first delayer to an output terminal of the delayed input signal generating means in response to the first delay control signals;

a second switching transistor for outputting an output signal from the second delayer to the output terminal of the delayed input signal generating means in response to the second delay control signals; and a third switching transistor for outputting an output signal from the third delayer to the output terminal of the delayed input signal generating means in response to the third delay control signals.

19. The delay adjusting apparatus in accordance with claim 1, wherein the delay time storage means includes:

a delay time determining unit for receiving the test mode signal and for activating one of a plurality of delay control signals while the test mode signal is in a high voltage level, wherein the pulse widths of the delay control signals are determined by a duration of a high level of the control signal; and a delay register unit which includes:

a first delay counting means for delaying and counting the internal clock signal in response to the enable signal and the delay first control signal;

a second delay counting means for delaying counting an output signal from the first delay counting means in response to the enable signal and the delay second control signal;

a third delay counting means for delaying and counting an output signal from the second delay counting means in response to the enable signal and the delay second control signal; and a plurality of switches for respectively outputting output signals from the first to third delay counting means.

20. The delay adjusting apparatus in accordance with claim 19, wherein the first delay counting means includes:

an eleventh inverter for receives and inverts the internal clock signal;

a thirteen NAND gate for receiving the enable signal EN and an output signal from the eleventh inverter in order to perform a NAND operation;

a twelfth inverter for inverting an output signal from the thirteenth NAND gate;

a thirteenth inverter for inverting an output signal from the twelfth inverter; and a fourteenth inverter for inverting an output signal from the thirteenth inverter, being coupled to an input terminal of the eleventh inverter.

21. The delay adjusting apparatus in accordance with claim 19, wherein the second delay counting means includes:

a first transistor having a gate to which the output signal from the first delay counting means;

a sixteenth inverter coupled to the first transistor for inverting an output signal from the first transistor;

a seventeenth inverter for receiving and inverting an output signal from the sixteenth inverter, thereby forming a latch circuit together with the sixteenth inverter.

a second transistor having a gate to which the output signal from the first delay counting means is applied, being coupled to the sixteenth inverter;

an eighteenth inverter coupled to the second transistor for inverting an output signal from the second transistor;

a fourteenth NAND gate for receiving the enable signal EN and an inverted signal from the eighteenth inverter in order to output a result of the NAND operation to the eighteenth inverter; and a nineteenth inverter for inverting an output signal from the eighteenth inverter and for outputting an inverted signal to the first transistor.

22. The delay adjusting apparatus in accordance with claim 3, wherein the delay adjusting apparatus further comprises an internal clock signal generating means, and wherein the internal clock signal generating means includes:

an external clock buffer for temporally storing an external clock signal; and a switching means for receiving the test mode signal and for selectively outputting the external clock signal or the delayed input signal from the delay register unit to the internal clock signal generator in response to the enable signal.

23. A delay adjusting apparatus in a semiconductor device comprising:

a control signal divider for producing a plurality of delay control signals using an input control signal in a test mode; and a plurality of unit delayers which are in series coupled to each other, wherein one of delayed input data signals outputted from the plurality of unit delayers is selectively outputted in response to each delay control signal.

24. The delay adjusting apparatus in accordance with claim 23, wherein the control signal divider includes:

a plurality of delayers, which are in series coupled to each other, for delaying the input control signal and outputting a plurality of delayed control signals; and a pulse adjusting means for adjusting and trimming a plurality of delayed control signals in response to a test mode signal.

* * * * *